US012645243B2

(12) United States Patent
Iwai

(10) Patent No.: US 12,645,243 B2
(45) Date of Patent: Jun. 2, 2026

(54) SEMICONDUCTOR INTEGRATED CIRCUIT AND ELECTRONIC DEVICE

(71) Applicant: Kioxia Corporation, Tokyo (JP)

(72) Inventor: Takayuki Iwai, Tokyo (JP)

(73) Assignee: Kioxia Corporation, Tokyo (JP)

( * ) Notice: Subject to any disclaimer, the term of this patent is extended or adjusted under 35 U.S.C. 154(b) by 284 days.

(21) Appl. No.: 18/590,600

(22) Filed: Feb. 28, 2024

(65) Prior Publication Data

US 2024/0329680 A1 Oct. 3, 2024

(30) Foreign Application Priority Data

Mar. 29, 2023 (JP) ................................. 2023-053189

(51) Int. Cl.
 *G05F 3/26* (2006.01)
 *G11C 16/30* (2006.01)
 *G11C 16/04* (2006.01)
(52) U.S. Cl.
 CPC .............. *G05F 3/262* (2013.01); *G11C 16/30* (2013.01); *G11C 16/0483* (2013.01)
(58) Field of Classification Search
 CPC ..... G05F 3/262; G11C 16/30; G11C 16/0483; H02M 1/00; H02M 1/0003; H02M 1/0025; H02M 1/36
 See application file for complete search history.

(56) References Cited

U.S. PATENT DOCUMENTS

| | | | | |
|---|---|---|---|---|
| 9,917,513 B1 * | 3/2018 | Le | ............................. | G05F 1/56 |
| 11,940,829 B2 * | 3/2024 | Guiraud | ................. | G05F 1/575 |
| 2009/0160419 A1 | 6/2009 | Jang | | |
| 2014/0306751 A1 | 10/2014 | Nakamoto | | |

FOREIGN PATENT DOCUMENTS

| | | |
|---|---|---|
| JP | 2014-206825 A | 10/2014 |
| JP | 2016-212476 A | 12/2016 |
| JP | 2021-114325 A | 8/2021 |
| TW | I375873 B1 | 11/2012 |

* cited by examiner

*Primary Examiner* — Kyle J Moody
(74) *Attorney, Agent, or Firm* — Kim & Stewart LLP

(57) ABSTRACT

A semiconductor integrated circuit includes first and second circuits, a smoothing circuit, and a control circuit. The first circuit is configured to generate a first current with a power supply voltage and output the first current to an output terminal. The second circuit is configured to divide the power supply voltage and output a second current corresponding to a divided voltage to the output terminal. The second current is greater than the first current. The control circuit is configured to, in response to an enable signal, turn on the second circuit for a first period of time, during which the controller causes the first and second currents to be supplied to the output terminal, and in response to elapse of the first period of time, turn off the second circuit and cause the first current, and not the second current, to be supplied to the output terminal.

20 Claims, 3 Drawing Sheets

SEMICONDUCTOR INTEGRATED CIRCUIT AND ELECTRONIC DEVICE

CROSS-REFERENCE TO RELATED APPLICATION(S)

This application is based upon and claims the benefit of priority from Japanese Patent Application No. 2023-053189, filed Mar. 29, 2023, the entire contents of which are incorporated herein by reference.

FIELD

Embodiments described herein relate generally to a semiconductor integrated circuit and an electronic device.

BACKGROUND

In semiconductor integrated circuits, a Band Gap Reference (BGR) circuit is used as a circuit for generating an operation voltage. Since the BGR circuit generates an operation voltage used in semiconductor integrated circuits, it is desirable that the operation voltage has low temperature dependence and high stability.

In mobile communication equipment and the like, high-speed start-up of power supply system circuits including the BGR circuit is desirable. Additionally, in order to improve communication quality, a higher Power Supply Rejection Ratio (PSRR) is desirable for the BGR circuit provided in the power supply system circuit.

Generally, in order to stabilize a power supply voltage in a power supply circuit, a Low Pass Filter (LPF) is disposed at an output stage. However, it is difficult to achieve high-speed start-up of the power supply circuit including the LPF because rising of an output voltage thereof is delayed due to a capacity component in the LPF.

DETAILED DESCRIPTION

Embodiments provide a semiconductor integrated circuit and an electronic device, directed to achieving both high stability and high-speed start-up.

In general, according to an embodiment, a semiconductor integrated circuit includes a first circuit, a second circuit, a smoothing circuit, and a control circuit. The first circuit is configured to generate a first current, which is constant, with a power supply voltage supplied to the semiconductor integrated circuit and output the first current to an output terminal. The second circuit is configured to divide the power supply voltage and output a second current corresponding to a divided voltage to the output terminal. The second current is greater than the first current. The smoothing circuit includes a capacitor connected between the output terminal and ground. The control circuit is configured to, in response to an enable signal, turn on the second circuit for a first period of time, during which the controller causes the first and second currents to be supplied to the output terminal, and in response to elapse of the first period of time, turn off the second circuit and cause the first current, and not the second current, to be supplied to the output terminal.

Configuration in Embodiment

Figure 1:
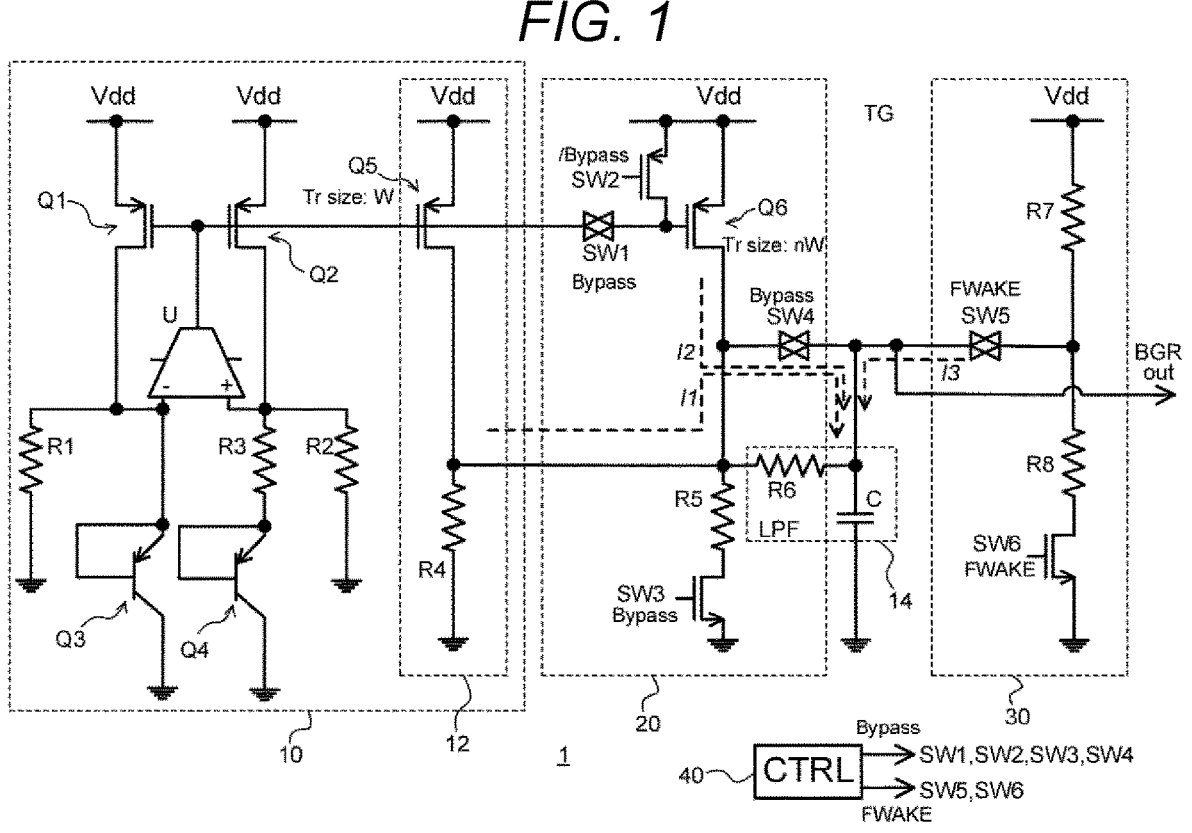
FIG. 1 is a circuit diagram illustrating an example of a semiconductor integrated circuit according to an embodiment.

FIG. 1 illustrates an example of a semiconductor integrated circuit according to an embodiment. A semiconductor integrated circuit 1 as a BGR circuit includes a voltage source circuit 10, an output circuit 12, a scaling circuit 20, a Low Pass Filter (LPF) 14, a voltage dividing circuit 30, and a control circuit 40. The voltage source circuit 10 includes the output circuit 12. A portion of the LPF 14 is provided in the scaling circuit 20.

The voltage source circuit 10 generates an operation voltage. In the example illustrated in FIG. 1, the voltage source circuit 10 includes MOSFETs Q1, Q2, and Q5, an operational amplifier U, transistors Q3 and Q4, and resistors R1 to R4. The MOSFETs Q1 and Q2 respectively include sources respectively connected to power supply wirings Vdd, gates connected to each other, and drains respectively connected to ground wirings via the resistors R1 to R2. The power supply wiring Vdd is a wiring to which a potential serving as the power supply voltage when the semiconductor integrated circuit 1 operates is supplied. The ground wiring is a wiring to which a reference potential when the semiconductor integrated circuit 1 operates is supplied.

The operational amplifier U includes an output terminal connected to the gates of the MOSFETs Q1 and Q2, an inverting input terminal connected to the drain of the MOSFET Q1, and a non-inverting input terminal connected to the drain of the MOSFET Q2. The transistor Q3 includes a base, an emitter connected to the inverting input terminal of the operational amplifier U and the base thereof, and a collector connected to the ground wiring. The transistor Q4 includes a base, an emitter connected to the base thereof, and a collector connected to the ground wiring. The emitter and the base of the transistor Q4 are further connected to the non-inverting input terminal of the operational amplifier U via the resistor R3.

The operational amplifier U negatively feeds back a difference between a drain voltage of the MOSFET Q1 and a drain voltage of the MOSFET Q2 to the gate of the MOSFET Q1 and the gate of the MOSFET Q2. According to this function, the drain voltage of the MOSFET Q1 and the drain voltage of the MOSFET Q2 are kept equal to each other. Namely, the operational amplifier U can stabilize an output voltage thereof.

The MOSFET Q5 includes a source connected to the power supply wiring Vdd, a gate connected to the gates of the MOSFETs Q1 and Q2, and a drain connected to the ground wiring via the resistor R4. The MOSFETs Q1, Q2, and Q5 form a current mirror circuit. The current mirror circuit and the operational amplifier U jointly act as a constant current circuit configured to keep the drain currents of the MOSFETS Q1, Q2, and Q5 constant. The MOSFET Q5 and the resistor R4 form the output circuit 12 provided in the voltage source circuit 10.

In FIG. 1, a voltage between the emitter and the collector of the transistor Q3 has a negative coefficient with respect to temperature. Accordingly, the drain voltage of the MOSFET Q1 decreases in accordance with an increase of the temperature. Since the drain voltage of the MOSFET Q1 and the drain voltage of the MOSFET Q2 become equal to each other due to the operation of the current mirror circuit and the operational amplifier U, the drain voltage of the MOSFET Q2 decreases in accordance with the increase of temperature. Accordingly, a current flowing through the resistor R2 to which the drain voltage of the MOSFET Q2 is applied also has a negative coefficient with respect to the temperature. In contrast, a current flowing through the resistor R3 increases in accordance with the increase of temperature. Accordingly, a temperature dependence of the current flowing through the resistor R2 and a temperature dependence of the current flowing through the resistor R3 are canceled, and the drain current of the MOSFET Q5 in the output circuit 12 becomes a current independent of temperature. Namely, the transistors Q3 and Q4 and the resistors R1 to R3 serve as a temperature compensation circuit.

Thus, the voltage source circuit 10 can output a stabilized voltage that is independent of temperature.

The scaling circuit 20 scales up an output current of the voltage source circuit 10. Namely, the scaling circuit 20 increases the output current of the voltage source circuit 10. In the example illustrated in FIG. 1, the scaling circuit 20 includes a MOSFET Q6, switches SW1 to SW4, and resistors R5 and R6. The MOSFET Q6 includes a source connected to the power supply wiring Vdd, a gate to which the switches SW1 and SW2 are connected, and a drain connected to the ground wiring via the resistor R5 and the switch SW3. The switches SW1 and SW4 may be implemented by, for example, transfer gates (transmission gates). The switches SW2 and SW3 may be implemented by, for example, switching elements, such as MOSFETs.

The gate of the MOSFET Q6 is connected to the gate of the MOSFET Q5 in the voltage source circuit 10 (i.e., the output circuit 12) via the switch SW1. Namely, when the switch SW1 is ON, the MOSFETs Q1, Q2, Q5, and Q6 form a current mirror circuit. Moreover, the gate of the MOSFET Q6 is connected to the power supply wiring Vdd via the switch SW2. The drain of the MOSFET 06 is connected to the drain of the MOSFET Q5. Furthermore, the drain of the MOSFET Q6 is connected to the switch SW4 and the LPF 14.

Here, the MOSFET Q6 in the scaling circuit 20 has a wiring width equal to or more than twice that of the MOSFET Q5 in the voltage source circuit 10. This means that the MOSFET Q6 can flow equal to or more than twice as much current as the MOSFET Q5. Namely, the scaling circuit 20 serves to scale the output current of the voltage source circuit 10. That is, the output current of the scaling circuit 20 is proportional to and greater than the output current of the voltage source circuit 10.

The switches SW1, SW2, and SW3 can be turned ON or OFF in accordance with external control signals Bypass and/Bypass. The control signal/Bypass is an inverted signal of the control signal Bypass. Here, there is a relationship that the switch SW2 is turned OFF and the switch SW3 is turned ON when the switch SW1 is ON, and the switch SW2 is turned ON and the switch SW3 is turned OFF when the switch SW1 is OFF.

The LPF 14 smooths a voltage (i.e., an output voltage) of an output BGRout of the semiconductor integrated circuit 1. The LPF 14 includes the resistor R6 and a capacitor C, and forms a so-called CR filter. One end of the resistor R6 is connected to the drain of the MOSFET Q5 and the drain of the MOSFET Q6, and the other end of the resistor R6 is connected to one end of the capacitor C. The other end of the capacitor C is connected to the ground wiring. An intersection point between the other end of the resistor R6 and the one end of the capacitor C is connected to the drain of the MOSFET Q6 via the switch SW4. The intersection point of the other end of the resistor R6 and the one end of the capacitor C is connected to the output BGRout.

When the switches SW1, SW3, and SW4 are ON and the switch SW2 is OFF, the gate of the MOSFET Q5 and the gate of the MOSFET Q6 are connected to each other and the drain of the MOSFET Q6 is connected to the ground wiring via the resistor R5. In this state, the scaling circuit 20 starts an operation and the output of the voltage source circuit 10 and the output of the scaling circuit 20 are input into the capacitor C in the LPF 14 via the switch SW4. Such an operation serves to quickly stabilize the output voltage of the output BGRout.

In contrast, when the switches SW1, SW3, and SW4 are OFF and the switch SW2 is ON, the gate of the MOSFET Q5 and the gate of the MOSFET Q6 are disconnected from each other, and the scaling circuit 20 stops the operation. In this state, the output of the voltage source circuit 10 is input into the resistor R6 in the LPF 14.

The voltage dividing circuit 30 quickly rises the output voltage of the output BGRout. The voltage dividing circuit 30 has resistors R7 and R8 connected in series, and switches SW5 and SW6. One end of the resistor R7 is connected to one end of the resistor R8. The other end of the resistor R7 is connected to the power supply wiring Vdd. The other end of the resistor R8 is connected to the ground wiring via the switch SW6. An intersection point between the resistors R7 and R8 is connected via the switch SW5 to the intersection point between the other end of the resistor R6 and the one end of the capacitor C. The switches SW5 and SW6 can be turned ON or OFF in accordance with an external control signal FWAKE.

When the switches SW5 and SW6 are ON, the resistors R7 and R8 become voltage dividing resistors for the voltage of the power supply wiring Vdd, and the divided voltage is input into the capacitor C in the LPF 14 via the switch SW5. Such an operation serves to quickly rise the output voltage of the output BGRout.

The control circuit 40 generates (changes levels of) the control signal Bypass and the control signal FWAKE for controlling the switches SW1 to SW6 at particular timings. The control circuit 40 may generate the control signal/Bypass together with the control signal Bypass. The control signal/Bypass may be generated on the basis of the control signal Bypass by another circuit instead of the control circuit 40. The switch SW5 may be implemented by the transfer gate. The switch SW6 may be implemented by, for example, a switching element such as MOSFET.

Operation in Embodiment

Figures 2, 3:
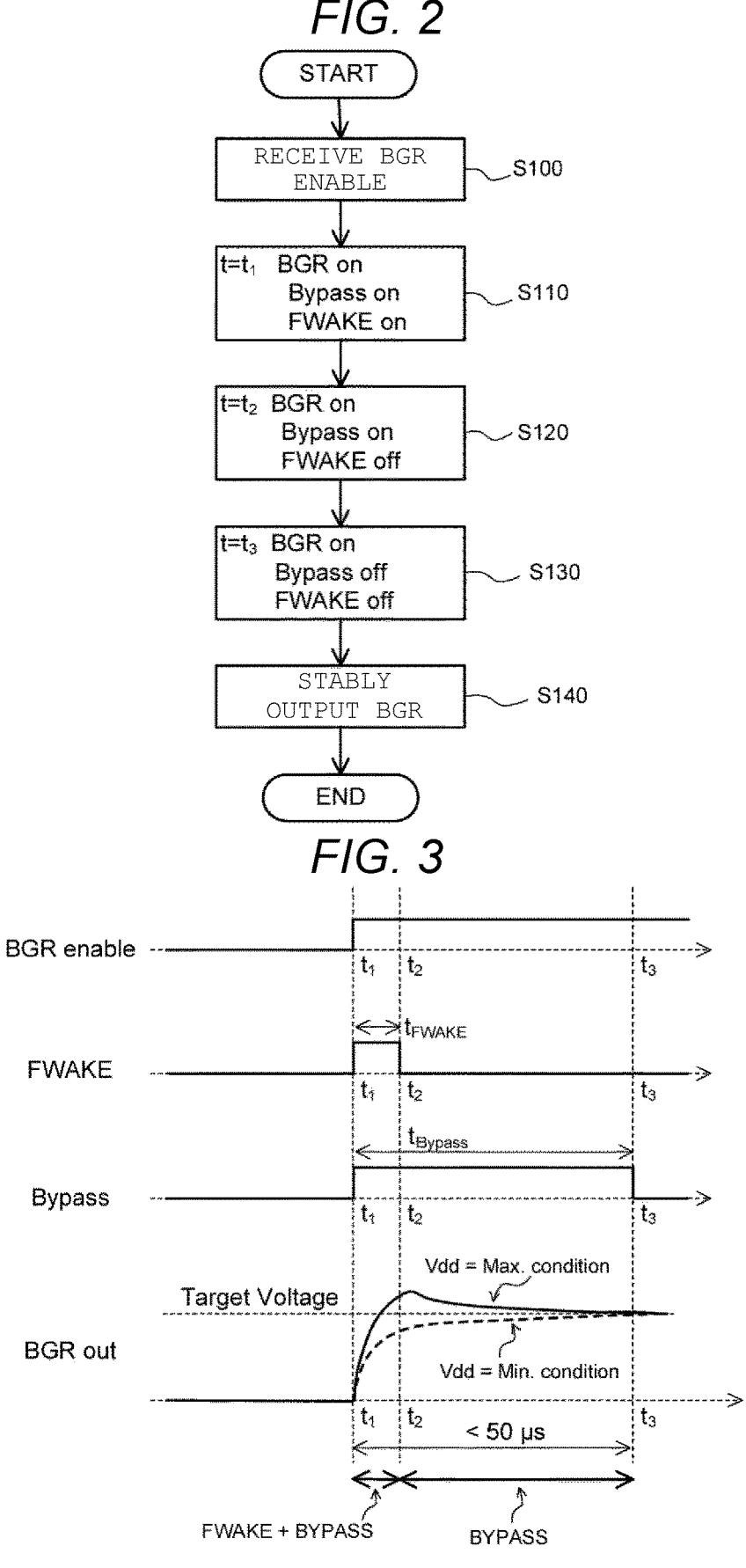
FIG. 2 is a flow chart illustrating an example of a control operation in the semiconductor integrated circuit according to the embodiment.
FIG. 3 is a timing chart illustrating the example of the control operation in the semiconductor integrated circuit according to the embodiment.

Subsequently, an operation of the semiconductor integrated circuit 1 according to the embodiment will be described with reference to FIGS. 1 to 3. FIG. 2 is a flow chart illustrating a control operation in the semiconductor integrated circuit according to the embodiment. FIG. 3 is a timing chart illustrating the control operation in the semiconductor integrated circuit according to the embodiment.

When the control circuit 40 receives, at time $t_1$, a BGR enable signal for enabling a circuit operation (S100), the control circuit 40 outputs a signal (e.g., an H-level signal) for enabling the control signal Bypass and the control signal FWAKE (S110). As a result, as illustrated in FIG. 1, the switches SW1, SW3, and SW4 are turned ON, the switch SW2 is turned OFF, and the switches SW5 and SW6 are turned ON.

At this time, the voltage source circuit 10 outputs a certain voltage, and a current I1 flows from the drain of the MOSFET Q5 toward the switch SW4. The current I1 flows into the capacitor C in the LPF 14 and the output BGRout.

Moreover, the scaling circuit 20 starts the operation in response to the control signal Bypass. Furthermore, the switch SW4 is turned ON in response to the control signal Bypass. At this time, a current I2 flows from the drain of the MOSFET Q6 toward the capacitor C in the LPF 14 and the output BGRout via the switch SW4.

Furthermore, the voltage dividing circuit 30 starts the operation in response to the control signal FWAKE. The voltage of the power supply wiring Vdd is divided by the resistors R7 and R8. At this time, a current I3 flows from the intersection point between the one end of each of the resistors R7 and R8 toward the capacitor C in the LPF 14 and the output BGRout.

As illustrated in FIG. 3, at time $t_1$, when the BGR enable signal is turned to an H (High) level, the control signal FWAKE and the control signal Bypass are also turned to the H level. The voltage source circuit 10, the scaling circuit 20, and the voltage dividing circuit 30 are started, and the output voltage appears at the output BGRout. At this time, the current I2 from the scaling circuit 20 and the current I3 from the voltage dividing circuit 30 are added to the current I1 from the voltage source circuit 10, and the capacitor C in the LPF 14 is charged.

Consequently, a rising of the output voltage when the scaling circuit 20 and the voltage dividing circuit 30 are started in parallel approaches a target voltage more quickly than a rising of the output voltage when only the voltage source circuit 10 is started. As illustrated in FIG. 3, in a case where the voltage of the power supply wiring Vdd is under a minimum condition (Min) (e.g., expressed by the dashed line in FIG. 3), a rising of the output voltage is later than the rising in a case where the voltage of the power supply wiring Vdd is under a maximum condition (Max) (e.g., expressed by the solid line in FIG. 3), but is earlier than the rising in a case where only the voltage source circuit 10 is started.

As illustrated in FIG. 2, subsequently, at time $t_2$, the control circuit 40 outputs a signal (e.g., an L-level signal) for keeping the control signal Bypass to be enabled and disabling the control signal FWAKE (S120). As a result, the switches SW1, SW3, and SW4 are kept ON, the switch SW2 is kept OFF, and the switches SW5 and SW6 are turned OFF. Consequently, the voltage dividing circuit 30 stops the operation, thereby the current I3 becomes zero and the current flowing into the capacitor C in the LPF 14 and the output BGRout decreases.

As illustrated in FIG. 3, at time $t_2$, when the control signal FWAKE is controlled to the L (Low) level, the current I3 is no longer added to the current flowing into the output BGRout. As a result, when the voltage of the power supply wiring Vdd is under the maximum condition (Max), the output voltage of the output BGRout is changed from rising to falling. Namely, by controlling the current I3 from the voltage dividing circuit 30, the output voltage of the output BGRout quickly rises, and the output voltage falls after exceeding the target voltage. Time $t_{FWAKE}$ during which the control signal FWAKE keeps the H level is set at a timing such that the output voltage of the output BGRout falls quickly without exceeding the target voltage too much. Moreover, when the voltage of the power supply wiring Vdd is under the minimum condition (Min), a slope of the rising of the output voltage becomes a little gentler.

As illustrated in FIG. 2, in time $t_3$, the control circuit 40 outputs a signal (e.g., the L-level signal) for disabling the control signal Bypass and the control signal FWAKE (S130). As a result, the switches SW1, SW3, and SW4 are turned OFF, the switch SW2 is turned ON, and the switches SW5 and SW6 are kept OFF. The scaling circuit 20 stops the operation, the current I2 becomes zero, and the current flowing into the capacitor C in the LPF 14 and the output BGRout further decreases.

As illustrated in FIG. 3, at time $t_3$, when the control signal Bypass and the control signal FWAKE are controlled to be the L level, the drain voltage of the MOSFET Q5 in the voltage source circuit 10 is directly applied to the resistor R6 in the LPF 14, and the current which flows into the capacitor C in the LPF 14 and the output BGRout becomes only the current I1. The output voltage of the output BGRout, which has quickly risen at time $t_1$, was turned to decrease or gently rose at time $t_2$, and converges to the target voltage at time $t_3$. Time $t_{Bypass}$ during which the control signal Bypass keeps the H level is set to a timing (a period of time) at which the output voltage converges to the target voltage. For example, the time $t_{Bypass}$ is set to not exceed 50 μs.

After the control circuit 40 controls the control signal Bypass and the control signal FWAKE to be the L level at time $t_3$, the semiconductor integrated circuit 1 outputs a stable voltage (S140).

In FIG. 1, the output current I1 of the voltage source circuit 10, the output current I2 of the scaling circuit 20, and the output current I3 of the voltage dividing circuit 30 each have the following relationships:

$$I1 < I2 < I3.$$

Namely, the voltage dividing circuit 30 can charge the capacitor C in the LPF 14 at the highest speed. However, the voltage of the output current in the voltage dividing circuit 30 is generated by dividing the power supply wiring Vdd, which tends to have large variations in voltage values.

In contrast, since the scaling circuit 20 has a smaller output current than that of the voltage dividing circuit 30, the charging speed of the capacitor C in the LPF 14 is not as fast as that of the voltage dividing circuit 30. However, since the output voltage of the scaling circuit 20 is obtained by scaling the output current of the voltage source circuit 10, the voltage value is stable.

In the semiconductor integrated circuit 1 according to the embodiment, in order to quickly rise the output voltage of the output BGRout when the voltage source circuit 10 is started, both the output of the scaling circuit 20 and the output of the voltage dividing circuit 30 are added to the output of the voltage source circuit 10 in an initial stage (e.g., a time period of logical AND of the time $t_{FWAKE}$ and the time $t_{Bypass}$). In contrast, since the output current of the voltage dividing circuit 30 is large, there is a possibility that the output voltage of the output BGRout exceeds the target voltage. Therefore, the semiconductor integrated circuit 1 stops the operation and output of the voltage dividing circuit 30 after the time $t_{FWAKE}$ elapses.

The output current of the scaling circuit 20 is smaller than the output current of the voltage dividing circuit 30. However, when rising delay of the output voltage of the output BGRout is eliminated, stable output can be obtained by using only the voltage source circuit 10 even when the operation of the scaling circuit 20 is stopped. Therefore, the semiconductor integrated circuit 1 stops the operation and output of the scaling circuit 20 at the timing when the output voltage of the output BGRout converges to the target voltage, i.e., after the time period $t_{Bypass}$ elapses. After the time period $t_{Bypass}$ elapses, the switch SW4 is turned OFF. Therefore, the output of the voltage source circuit 10 is smoothed by the LPF 14, and is output from the output BGRout.

Thus, since the semiconductor integrated circuit 1 according to the embodiment includes the scaling circuit 20 and the voltage dividing circuit 30 in addition to the voltage source circuit 10, it is possible to quickly rise the output voltage and also can quickly converge the output voltage to the target voltage.

(Operation in Modified Example)

It is to be noted that in the above embodiment, the outputs of the scaling circuit 20 and the voltage dividing circuit 30 are added to the output of the voltage source circuit 10 when the voltage source circuit 10 is started, but it is not limited thereto. It may be configured to add only the output of the voltage dividing circuit 30 when the voltage source circuit 10 is started. Hereinafter, a modified example where only the output of the voltage dividing circuit 30 is added when the voltage source circuit 10 is started will be described with reference to FIGS. 1 and 4.

Figure 4:
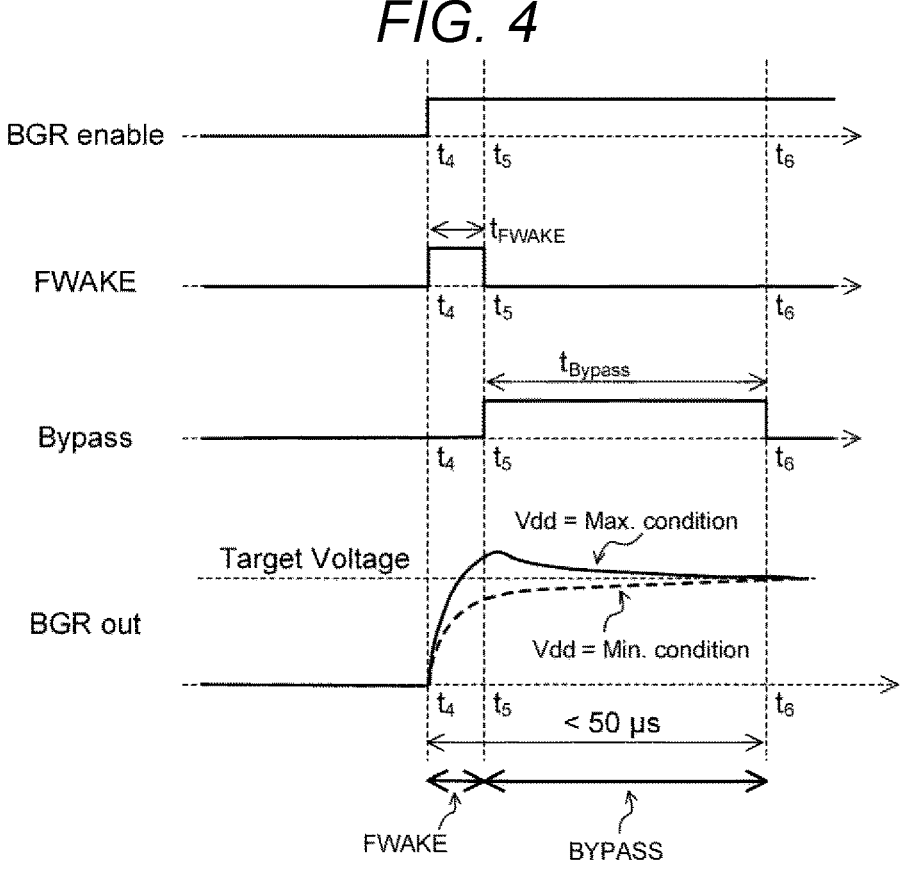
FIG. 4 is a timing chart illustrating a control operation of a modified example in the semiconductor integrated circuit according to the embodiment.

As illustrated in FIG. 4, at time $t_4$, when the BGR enable signal is turned to the H level, the control signal FWAKE is turned to the H level. At this time point, the control signal Bypass is kept as in the L level. The voltage source circuit 10 and the voltage dividing circuit 30 are started, and the output voltage appears in the output BGRout. At this time, the current I3 from the voltage dividing circuit 30 is added to the current I1 from the voltage source circuit 10, and the capacitor C in the LPF 14 is charged.

Consequently, the rising of the output voltage when the voltage dividing circuit 30 is started in parallel approaches the target voltage more quickly than the rising of the output voltage when only the voltage source circuit 10 is started.

Subsequently, at time $t_5$, when the control signal FWAKE is controlled to the L level, the current I3 is no longer added to the current flowing into the output BGRout. On the other hand, the control signal Bypass is controlled to be the H level, at time to. As a result, when the voltage of the power supply wiring Vdd is under the maximum condition (Max), the output voltage of the output BGRout is changed from rising to falling. Namely, the output voltage falls after exceeding the target voltage by switching to the current I2 from the scaling circuit 20 that is smaller than the current I3 from the voltage dividing circuit 30. The time $t_{FWAKE}$ during which the control signal FWAKE keeps the H level is set at a timing (a period of time) such that the output voltage of the output BGRout falls quickly without exceeding the target voltage too much. Moreover, when the voltage of the power supply wiring Vdd is under the minimum condition (Min), a slope of the rising of the output voltage becomes a little gentler.

Furthermore, at time $t_3$, when the control signal Bypass is controlled to be the L level, the drain voltage of the MOSFET Q5 in the voltage source circuit 10 is directly applied to the resistor R6 in the LPF 14, and a current which flows into the capacitor C in the LPF 14 and the output BGRout is only the current I1. The output voltage of the output BGRout, which has quickly risen at time $t_4$, was turned to decrease or gently rose at time $t_3$, and converges to the target voltage at time to. The time $t_{Bypass}$ during which the control signal Bypass keeps the H level is set to the timing (a period of time) at which the output voltage converges to the target voltage. For example, the time $t_{Bypass}$ is set to not exceed 50 μs.

Second Embodiment

Next, an electronic device according to a second embodiment will be described with reference to FIG. 5. In the following description, elements common to the elements in the first embodiment are denoted by common reference signs, and duplicated description may be omitted.

Figure 5:
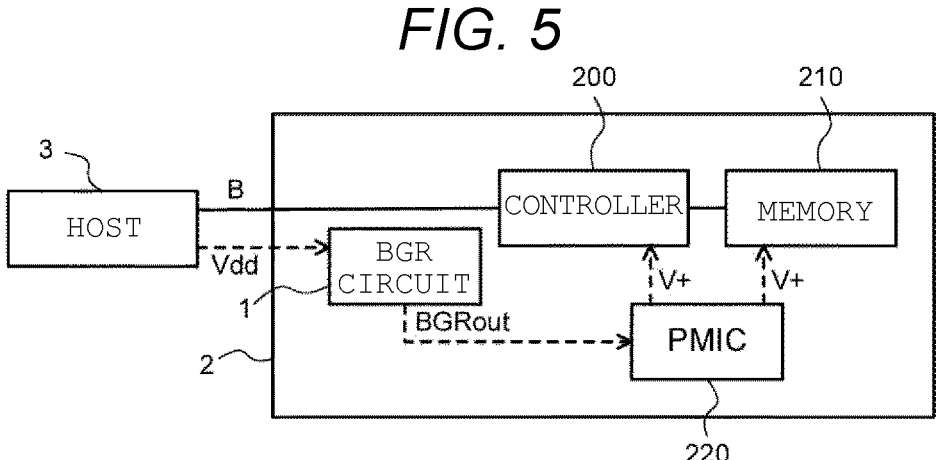
FIG. 5 is a block diagram illustrating a configuration of an electronic device according to an embodiment.

As illustrated in FIG. 5, an electronic device 2 according to the second embodiment configures a memory system. The electronic device 2 includes the semiconductor integrated circuit 1 as the BGR circuit according to the first embodiment, a controller 200, a memory 210, and a power management IC (PMIC) 220. The electronic device 2 can be connected to a host 3 via a signal line B and a power supply wiring Vdd. The signal line B is a bus line for transmitting and receiving signals between the electronic device 2 and the host 3, for example. The power supply wiring Vdd is a power supply line capable of supplying a predetermined voltage from the host 3 to the electronic device 2, for example.

The controller 200 is a functional element that implements a read operation, a write operation, an erase operation, an initializing operation, and the like of data to the memory 210 in response to commands from the host 3. The memory 210 is a semiconductor memory device including a NAND flash memory, for example. The memory 210 is connected to the controller 200 through a bus line, for example.

The PMIC 220 is a circuit element capable of generating a plurality of output voltages (i.e., operation voltages) having different voltage values. The PMIC 220 generates various output voltages V+ in response to the output BGRout from the semiconductor integrated circuit 1, and supplies the generated output voltages to the controller 200, the memory 210, and the like.

When supplied with the voltage via the power supply wiring Vdd, the semiconductor integrated circuit 1 as the BGR circuit supplies the output BGRout with a quick rise and high voltage stability to the PMIC 220 through the operation in the first embodiment. Upon receiving the output BGRout, the PMIC 220 generates the output voltage V+ to be supplied to the controller 200 and the memory 210.

According to the electronic device 2 according to the second embodiment, since the semiconductor integrated circuit 1 as the BGR circuit according to the first embodiment is provided, it is possible to demonstrate high stability and high-speed start-up with respect to the power supply voltage used inside the device.

While certain embodiments have been described, these embodiments have been presented by way of example only, and are not intended to limit the scope of the disclosure. Indeed, the novel embodiments described herein may be embodied in a variety of other forms; furthermore, various omissions, substitutions, and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor integrated circuit comprising:
a first circuit configured to generate a first current, which is constant, with a power supply voltage supplied to the semiconductor integrated circuit and output the first current to an output terminal;
a second circuit configured to divide the power supply voltage and output a second current corresponding to a divided voltage to the output terminal, the second current being greater than the first current;

a smoothing circuit including a capacitor connected between the output terminal and ground; and a control circuit configured to:

in response to an enable signal, turn on the second circuit for a first period of time, during which the controller causes the first and second currents to be supplied to the output terminal; and in response to elapse of the first period of time, turn off the second circuit and cause the first current, and not the second current, to be supplied to the output terminal.

2. The semiconductor integrated circuit according to claim 1, further comprising:

a third circuit configured to output a third current that is proportional to and greater than the first current to the output terminal, wherein the control circuit is configured to in response to an activation signal, turn on the third circuit for a second period of time longer than the first period of time, during which the controller causes the third current to be also supplied to the output terminal; and in response to elapse of the second period of time, turn off the third circuit and cause the first current, and not the third current, to be supplied to the output terminal.

3. The semiconductor integrated circuit according to claim 2, wherein the third current is less than the second current.

4. The semiconductor integrated circuit according to claim 2, wherein a difference between the second period of time and the first period of time is greater than the first period of time.

5. The semiconductor integrated circuit according to claim 2, wherein an output voltage at the output terminal converges to a target voltage substantially at the elapse of the second period of time.

6. The semiconductor integrated circuit according to claim 1, further comprising:

a third circuit configured to output a third current that is proportional to and greater than the first current to the output terminal, wherein the control circuit is configured to:

in response to the elapse of the first period of time, turn on the third circuit for a second period of time longer than the first period of time, during which the controller causes the first and third currents to be supplied to the output terminal; and in response to elapse of the second period of time, turn off the third circuit and cause the first current, and not the third current, to be supplied to the output terminal.

7. The semiconductor integrated circuit according to claim 6, wherein the third current is less than the second current.

8. The semiconductor integrated circuit according to claim 6, wherein an output voltage at the output terminal converges to a target voltage substantially at the elapse of the second period of time.

9. The semiconductor integrated circuit according to claim 1, wherein an output voltage at the output terminal is close to a target voltage at a time of the elapse of the first period of time.

10. The semiconductor integrated circuit according to claim 9, wherein when the power supply voltage is at a maximum value of a rated voltage, the output voltage exceeds the target voltage at the time of the elapse, and when the power supply voltage is at a minimum value of the rated voltage, the output voltage does not exceed the target voltage at the time of the elapse.

11. The semiconductor integrated circuit according to claim 9, wherein when the power supply voltage is at a maximum value of a rated voltage, the output voltage exceeds the target voltage during the first period of time.

12. The semiconductor integrated circuit according to claim 1, wherein the first circuit includes a current mirror circuit and an operational amplifier.

13. The semiconductor integrated circuit according to claim 12, wherein the first circuit further includes a temperature compensation circuit configured to stabilize an output voltage on the output terminal against temperature variation.

14. The semiconductor integrated circuit according to claim 1, wherein the smoothing circuit is a low pass filter circuit.

15. An electronic device comprising:

the semiconductor integrated circuit according to claim 1;

a memory;

a memory controller configured to control the memory; and a power management circuit configured to generate operation voltages based on an output voltage on the output terminal of the semiconductor integrated circuit, and output corresponding one of the operation voltages to the nonvolatile memory and the memory controller, respectively.

16. The electronic device according to claim 15, wherein the semiconductor integrated circuit further comprises:

a third circuit configured to output a third current that is proportional to and greater than the first current to the output terminal, wherein the control circuit is configured to in response to an activation signal, turn on the third circuit for a second period of time longer than the first period of time, during which the controller causes the third current to be also supplied to the output terminal; and in response to elapse of the second period of time, turn off the third circuit and cause the first current, and not the third current, to be supplied to the output terminal.

17. The electronic device according to claim 15, wherein the semiconductor integrated circuit further comprises:

a third circuit configured to output a third current that is proportional to and greater than the first current to the output terminal, wherein the control circuit is configured to:

in response to the elapse of the first period of time, turn on the third circuit for a second period of time longer than the first period of time, during which the controller causes the first and third currents to be supplied to the output terminal; and in response to elapse of the second period of time, turn off the third circuit and cause the first current, and not the third current, to be supplied to the output terminal.

18. The electronic device according to claim 15, wherein an output voltage at the output terminal is close to a target voltage at a time of the elapse of the first period of time.

19. The electronic device according to claim 15, wherein the first circuit includes a current mirror circuit and an operational amplifier.

20. The electronic device according to claim 15, wherein the smoothing circuit is a low pass filter circuit.

* * * * *